United States Patent
Cekli et al.

(10) Patent No.: US 10,545,410 B2
(45) Date of Patent: Jan. 28, 2020

(54) LITHOGRAPHIC APPARATUS, DEVICE MANUFACTURING METHOD AND ASSOCIATED DATA PROCESSING APPARATUS AND COMPUTER PROGRAM PRODUCT

(71) Applicant: ASML NETHERLANDS B.V., Veldhoven (NL)

(72) Inventors: Hakki Ergun Cekli, Singapore (SG); Masashi Ishibashi, Eindhoven (NL); Leon Paul Van Dijk, Eindhoven (NL); Richard Johannes Franciscus Van Haren, Waalre (NL); Xing Lan Liu, Ukkel (BE); Reiner Maria Jungblut, Eindhoven (NL); Cedric Marc Affentauschegg, Leende (NL); Ronald Henricus Johannes Otten, Rosemalen (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/076,743

(22) PCT Filed: Feb. 7, 2017

(86) PCT No.: PCT/EP2017/052639
§ 371 (c)(1),
(2) Date: Aug. 9, 2018

(87) PCT Pub. No.: WO2014/140532
PCT Pub. Date: Aug. 24, 2017

(65) Prior Publication Data
US 2019/0079411 A1    Mar. 14, 2019

(30) Foreign Application Priority Data

Feb. 18, 2016  (EP) .................................. 16156361
Jan. 25, 2017  (EP) .................................. 17152954

(51) Int. Cl.
*G03B 27/42* (2006.01)
*G03F 7/20* (2006.01)
*G03F 9/00* (2006.01)

(52) U.S. Cl.
CPC ...... *G03F 7/70258* (2013.01); *G03F 7/70633* (2013.01); *G03F 7/70783* (2013.01); *G03F 9/7011* (2013.01); *G03F 9/7034* (2013.01)

(58) Field of Classification Search
CPC .............. G03F 9/7088; G03F 7/70783; G03F 7/70258; G03F 9/7034; G03F 9/7084; G03F 7/707; G03F 7/70716; G03F 9/7046
See application file for complete search history.

(56) References Cited

U.S. PATENT DOCUMENTS 6,654,096 B1   11/2003  Fujita et al.
2003/0035090 A1   2/2003  Imai et al.
(Continued)

FOREIGN PATENT DOCUMENTS

JP   2002343853   11/2002
JP   2005184015    7/2005
(Continued)

OTHER PUBLICATIONS

Brunner, Timothy, et al.: "Characterization of wafer geometry and overlay error on silicon wafers with non-uniform stress", Journal of Micro/Nanolith.MEMS, and MOEMS, Oct. 2013, vol. 12, pp. 043002-043002-12.
(Continued)

*Primary Examiner* — Mesfin T Asfaw
(74) *Attorney, Agent, or Firm* — Pillsbury Winthrop Shaw Pittman LLP

(57) ABSTRACT

A lithographic process includes clamping a substrate onto a substrate support, measuring positions across the clamped
(Continued)

substrate, and applying a pattern to the clamped substrate using the positions measured. A correction is applied to the positioning of the applied pattern in localized regions of the substrate, based on recognition of a warp-induced characteristic in the positions measured across the substrate. The correction may be generated by inferring one or more shape characteristics of the warped substrate using the measured positions and other information. Based on the one or more inferred shape characteristics, a clamping model is applied to simulate deformation of the warped substrate in response to clamping. A correction is calculated based on the simulated deformation.

20 Claims, 7 Drawing Sheets

(56) References Cited

U.S. PATENT DOCUMENTS

| | | |
|---|---|---|
| 2005/0031975 A1 | 2/2005 | Reuhman-Huisken et al. |
| 2005/0134865 A1 | 6/2005 | Schoonewelle et al. |
| 2006/0216025 A1* | 9/2006 | Kihara ................ G03F 7/70783 396/611 |
| 2007/0085991 A1 | 4/2007 | Liegl et al. |
| 2008/0299492 A1 | 12/2008 | Kiuchi et al. |
| 2009/0042115 A1 | 2/2009 | Inoue et al. |
| 2009/0042139 A1 | 2/2009 | Shiraishi et al. |
| 2012/0008127 A1 | 1/2012 | Tel et al. |
| 2012/0208301 A1 | 8/2012 | Izikson et al. |
| 2013/0230797 A1 | 9/2013 | Van Der Sanden et al. |
| 2014/0107998 A1 | 4/2014 | Vukkadala et al. |
| 2015/0205213 A1 | 7/2015 | Cekli et al. |

FOREIGN PATENT DOCUMENTS

| | | |
|---|---|---|
| JP | 2006269867 | 10/2006 |
| JP | 2013153167 | 8/2013 |
| WO | 2015/104074 | 7/2015 |

OTHER PUBLICATIONS

Turner Kevin, et al.: "Role of wafer geometry in wafer chucking", Journal of Micro/Nanolithography, MEMS, and MOEMS, vol. 12, No. 2, Apr. 1, 2013, p. 23007, 9 pages.

Turner, Kevin T., et al.: "Predicting distortions and overlay errors due to wafer deformation during chucking on lithography scanners", Journal of Micro/Nanolithography, MEMS, and MOEMS, vol. 8, No. 4, Oct. 1, 2009, pp. 043015-1, 8 pages.

Anberg, D, et al.: "A Study of Feed-forward Strategies for Overlay Control in Lithography Processes Using CGS Technology", IEEE, ASMC 2015, pp. 395-400, 2015.

Ggiturner, Kevin T., et al: Relationship between localized wafer shape changes induced by residual stress and overlay errors, Journal of Micro/Nanolithography, MEMS, and MOEMS, vol. 11, No. 1, Mar. 21, 2012, pp. 013001-013001-8.

Mallik, Aditi, et al.: "Finite-Element Simulation of Different Kinds of Wafer Warpages: Spherical, Cylindrical, and Saddle", IEEE Transactions on Components, Packaging and Manufacturing Technology, vol. 4, No. 2, Feb. 2014, pp. 240-247.

International Search Report issued in PCT Application No. PCT/EP2017/052639, dated Jun. 9, 2017, 4 pages.

Brunner, Timothy A. et al.: "Patterned wafer geometry (PWG) metrology for improving process-induced overlay and focus problems", Proceedings of SPIE, vol. 9780, 2016, 11 pages.

Japanese Office Action issued in corresponding Japanese Patent Application No. 2018-541391, dated Aug. 26, 2019.

* cited by examiner

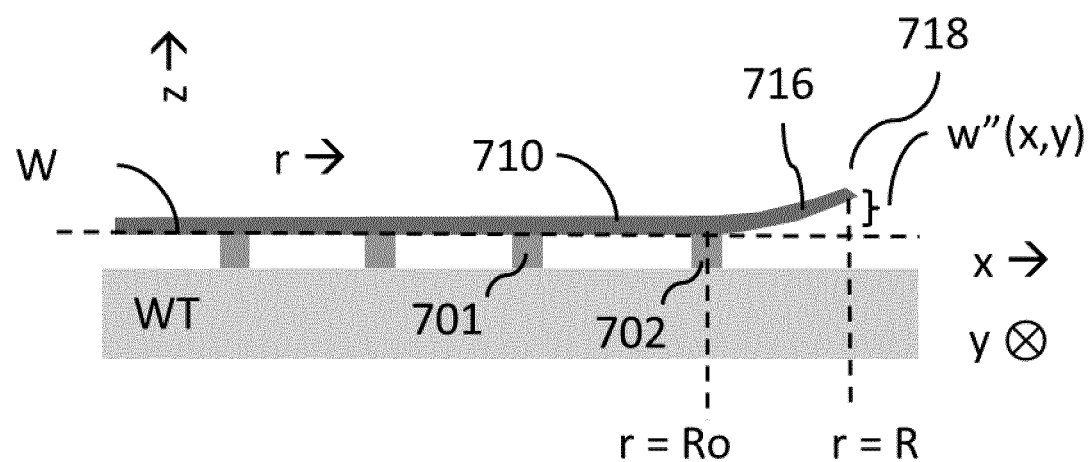
Fig. 7
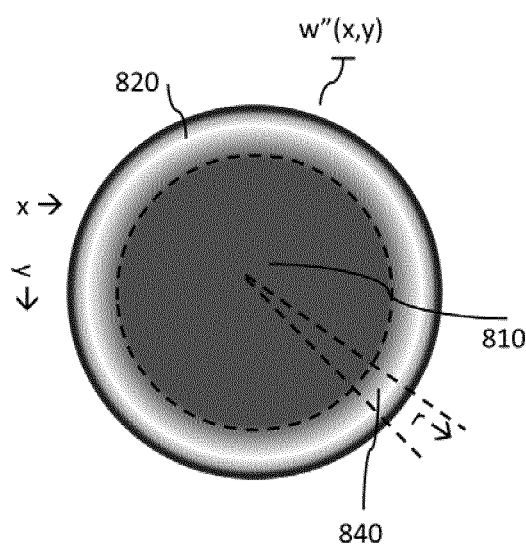 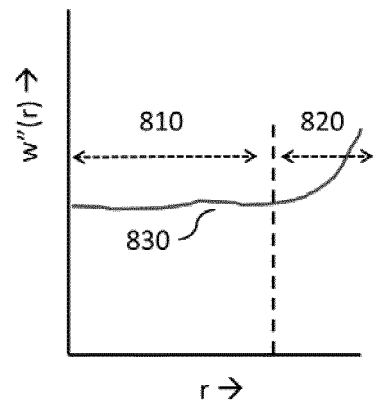
Fig. 8(a)　　　　　　　　　　　Fig. 8(b)

LITHOGRAPHIC APPARATUS, DEVICE MANUFACTURING METHOD AND ASSOCIATED DATA PROCESSING APPARATUS AND COMPUTER PROGRAM PRODUCT

CROSS-REFERENCE TO RELATED APPLICATIONS

This application is the U.S. national phase entry of PCT patent application no. PCT/EP2017/052639, which was filed on Feb. 7, 2017, which claims the benefit of priority of European patent application no. 16156361.4, which was filed on Feb. 18, 2016, and European patent application no. 17152954.8, which was filed on Jan. 25, 2017, each of which is incorporated herein in its entirety by reference.

BACKGROUND

Field of the Invention

The present invention relates to a lithographic apparatus. The present invention further relates to methods of manufacturing devices using such lithographic apparatus, and to data processing apparatuses and computer program products for implementing parts of such a method.

Background Art

A lithographic apparatus is a machine that applies a desired pattern onto a substrate, usually onto a target portion of the substrate. A lithographic apparatus is used, for example, in the manufacture of integrated circuits (ICs). In that instance, a patterning device, which is alternatively referred to as a mask or a reticle, may be used to generate a circuit pattern to be formed on an individual layer of the IC. This pattern is transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

A key performance parameter of the lithographic process is the overlay error. This error, often referred to simply as "overlay", is the error in placing product features in the correct position relative to features formed in previous layers. As device structures become ever smaller, overlay specifications become ever tighter.

Currently the overlay error is controlled and corrected by means of methods such as advanced process control (APC) described for example in US2012008127A1 and wafer alignment models described for example in US2013230797A1. The advanced process control techniques have been introduced in recent years and use measurements of metrology targets applied to substrates alongside the applied device pattern. The inspection apparatus may be separate from the lithographic apparatus. Within the lithographic apparatus, wafer alignment models are conventionally applied based on measurement of alignment marks provided on the substrate, the measurements being made as a preliminary step of every patterning operation. The alignment models nowadays include higher order models, to correct for non-linear distortions of the wafer. The alignment models may also be expanded to take into account other measurements and/or calculated effects such as thermal deformation during a patterning operation.

While alignment models and advanced process control have brought great reductions in overlay, not all errors are corrected. Some of these errors may be uncorrectable noise, for example, but others are correctable using available techniques in theory, but not economically correctable in practice. For example, one may envisage yet higher order models, but these in turn would require a higher spatial density of position measurements. The alignment marks and metrology targets occupy space on the substrate and are placed at specific locations, mainly in the scribe lanes between product areas. Deformations of the wafer grid in non-sampled areas (e.g. areas where ICs are printed) may be different than sampled areas. To increase the spatial density and/or measurement frequency of alignment marks and overlay targets would adversely affect both throughput of the lithographic process (wafers per hour) and the functional device area available on each substrate.

In some processing steps, stresses are introduced in the substrates (eg. wafers), such that the substrate topography changes and results in warped (non-flat) shapes. Warped wafers may adopt for example a bowl shape, a dome shape or a saddle shape. When a non-flat wafer is loaded onto a substrate support in the lithographic apparatus, clamping forces cause it to be (relatively) flat, prior to applying the device pattern. Due to the underlying stress in the wafer, an in-plane distortion is introduced. Most of this distortion is corrected by the above-mentioned alignment models up to the second order. However, this correction assumes that the clamped wafer is completely flat. In practice, imperfections in the wafer clamping may result in wafer "residual unflatness" (local deviation from a nominal planar shape). A common cause of imperfect clamping is the limited extension of support structures on the substrate support providing a contact surface to the substrate. Typically an edge region of the wafer is not supported by the support structures, leading to sub-optimal clamping (or no clamping) of the wafer at the edge region. The edge region of the substrate then may demonstrate a considerable non-flatness compared to a flattened central region of the substrate (being clamped to the substrate support). Hence the edge region of the substrate adopts a significantly different topography (eg shape) compared to the supported region of the substrate.

When the unflatness is different between a reference layer and a current layer, overlay errors are expected at the affected locations, which are not corrected by the existing alignment model.

Published international patent application WO2015104074A1 explains further how wafer unflatness introduces distortions (positional deviations) in the plane of the substrate, potentially leading to overlay error. Local height variations also lead to focusing errors, when the lithographic apparatus is one that applies the pattern by imaging. Studies of in-plane distortions that are introduced as a result of clamping non-flat substrates are described by Brunner et al, in "Characterization of wafer geometry and overlay error on silicon wafers with non-uniform stress", J. Micro/Nanolith. MEMS MOEMS 12(4), 043002 (October–

December 2013) published by SPIE. The contents of both publications are incorporated herein by reference.

SUMMARY OF THE INVENTION

It is an object of the invention to mitigate the effect of the residual non-flatness (eg residual warp) of a region of the substrate on the overlay and/or focus performance of the lithographic process.

Metrology tools are available to measure the shape (eg warping) of substrates, which could, in principle, be used as the basis of a correction system for these residual warp-induced errors. However, such additional measurements cannot always be applied to all the substrates in high-volume manufacturing facility. Measurements systems within the lithographic apparatus (eg. alignment and leveling sensors) are available, but it is not evident how to use alignment and leveling data to correct for residual warp-induced errors. The present invention has the aim of improving performance of a lithographic process using measurement data provided by either metrology tools and/or measurement systems within the lithographic apparatus. The measurement data is processed to enable determination of the residual non-flatness and subsequently a correction of the lithographic apparatus may be determined in order to mitigate effects associated with this residual non-flatness.

According to an aspect of the invention, there is provided a lithographic apparatus for applying a pattern onto a substrate, the apparatus including: a substrate support for clamping the substrate, an alignment sensor for measuring positions of features distributed across the clamped substrate, and a patterning system configured to apply said pattern to the clamped substrate while positioning the applied pattern based at least in part on positions measured by said alignment sensor, wherein said patterning system is configured to apply a correction to the positioning of the applied pattern in one or more regions of the substrate, based on recognition of a warp-induced alignment in positions measured across the substrate by the alignment sensor.

The invention exploits the availability of measurements of in-plane positional deviations within the lithographic apparatus, to infer the presence or absence of a warped shape of the substrate prior to clamping. Knowledge of the shape of the substrate prior to clamping is combined with knowledge of the effect of the clamping process on warped substrates to predict the residual unflatness. This prediction in turn allows a source of error in positioning the pattern to be corrected. The corrections may be made in a direction parallel to the plane of the substrate (to reduce overlay error) and/or in the direction perpendicular to the substrate (to reduce focus error).

Note that the local deviations are not directly observed in the measured positions. Rather, the observation of the warp-induced characteristic or "fingerprint" over the substrate as a whole allows the presence of local unflatness in specific regions to be predicted and corrected. In known examples, the local unflatness tends to affect especially edge regions of the substrate. In principle, the local unflatness could arise in some other region, depending on the warped substrate shape and the clamping forces applied.

Depending on the implementation, the inferences and knowledge mentioned in the preceding paragraphs, along with the characteristic or characteristics that are to be recognized in the position measurements, may be made explicit, or they may be only implicit. For example, explicit mathematical models of the warped substrate shape and the effect of clamping may be calculated. Alternatively, machine learning may be used to construct a look-up table (database), which, on the basis of the position measurements, outputs a prediction of the residual unflatness. The look-up table may output directly the correction to be applied to the in-plane positioning of the pattern, and/or in the focusing of an image. The recognition of a particular warp-induced characteristic may be expressed explicitly, or it may be implicit in the generation of a suitable prediction or correction of residual unflatness. References to "recognition" and "recognizing" should be interpreted accordingly.

In principle, the position measurements used for recognition of the warp-induced characteristics could be a superset or subset of the position measurements used by the patterning system to position the applied pattern more generally. In principle, it would be possible to use the alignment sensor(s) to make entirely separate sets of position measurements for these different purposes. Such an implementation would be within the scope of the present invention, while, in practice, a particular benefit of the invention is that it is possible to use the same data, and avoid additional measurement overhead.

The invention further provides a device manufacturing method comprising applying patterns in one or more layers on a substrate and processing the substrate to produce functional device features, wherein the step of applying a pattern in at least one of said layers comprises: (a) clamping the substrate onto a substrate support, (b) measuring positions of features distributed across the clamped substrate, and (c) applying said pattern to the clamped substrate while positioning the applied pattern based at least in part on some or all of positions measured in step (b), wherein said patterning step (c) includes applying a correction to the positioning of the applied pattern in one or more regions of the substrate, based on recognition of a warp-induced characteristic in some or all of the positions measured across the substrate in step (b).

The apparatus and method of the invention may be implemented in some embodiments by modifying control software of existing apparatuses.

The invention further provides a computer program product comprising machine-readable instructions for causing one or more processors to implement control of a lithographic apparatus according to the invention as set forth above.

The invention further provides a data processing system comprising one or more processors programmed to implement control of a lithographic apparatus according to the invention as set forth above.

The invention further provides a computer program product comprising machine-readable instructions for causing one or more processors to perform the steps (a) to (c) of a method according to the invention as set forth above.

The invention further provides a data processing system comprising one or more processors programmed to perform the steps (a) to (c) of a method according to the invention as set forth above.

It is further proposed to use substrate height map data that is representative of the residual unflatness of the substrate, typically at an edge region of the substrate. It is essential to have knowledge of the substrate support in order to utilize the correct mathematics to predict the in-plane-distortion and/or out-of-plane-distortion based on the height map data. For example the correct method to derive an in-plane-distortion associated with a clamped (non-flat) substrate differs for an optimally clamped region on the substrate and an edge region of the substrate which is not (or weakly) clamped to the substrate support. Knowledge of the substrate support characteristics will then enable identification of the sub-optimally clamped region(s) on the substrate and further enable the use of the correct mathematical methods to predict the in-plane-distortion and out-of-plane distortion for this sub-optimally clamped region.

According to an aspect of the invention there is provided a lithographic apparatus for applying a pattern onto a substrate, the apparatus including: a substrate support for clamping the substrate, a height sensor for measuring a height map of the clamped substrate, and a patterning system configured to apply the pattern to the clamped substrate while positioning the applied pattern, wherein the patterning system is configured to apply a correction to the positioning of the applied pattern based on the height map and a characteristic of the substrate support.

The invention further provides a device manufacturing method for applying patterns in one or more layers on a substrate clamped to a substrate support, the device manufacturing method comprising: (a) determining a height map of a region of the substrate, wherein the region is determined based on a characteristic of the substrate support; and (b) determining a correction to the device manufacturing method based on the height map and the characteristic of the substrate support.

The invention further provides a computer program product comprising machine-readable instructions for causing one or more processors to implement control of a lithographic apparatus or device manufacturing method according to the invention as set forth above.

The invention further provides a data processing system comprising one or more processors programmed to implement control of a lithographic apparatus or device manufacturing method according to the invention as set forth above.

BRIEF DESCRIPTION OF THE DRAWINGS

Embodiments of the invention will now be described, by way of example only, with reference to the accompanying schematic drawings in which:

FIG. 7 illustrates a substrate clamped to a substrate support provided with substrate support structures.

FIG. 8 illustrates a method of deriving a substrate height map from level sensor measurement results according to an embodiment of the invention.

DETAILED DESCRIPTION OF EXEMPLARY EMBODIMENTS

Figure 1:
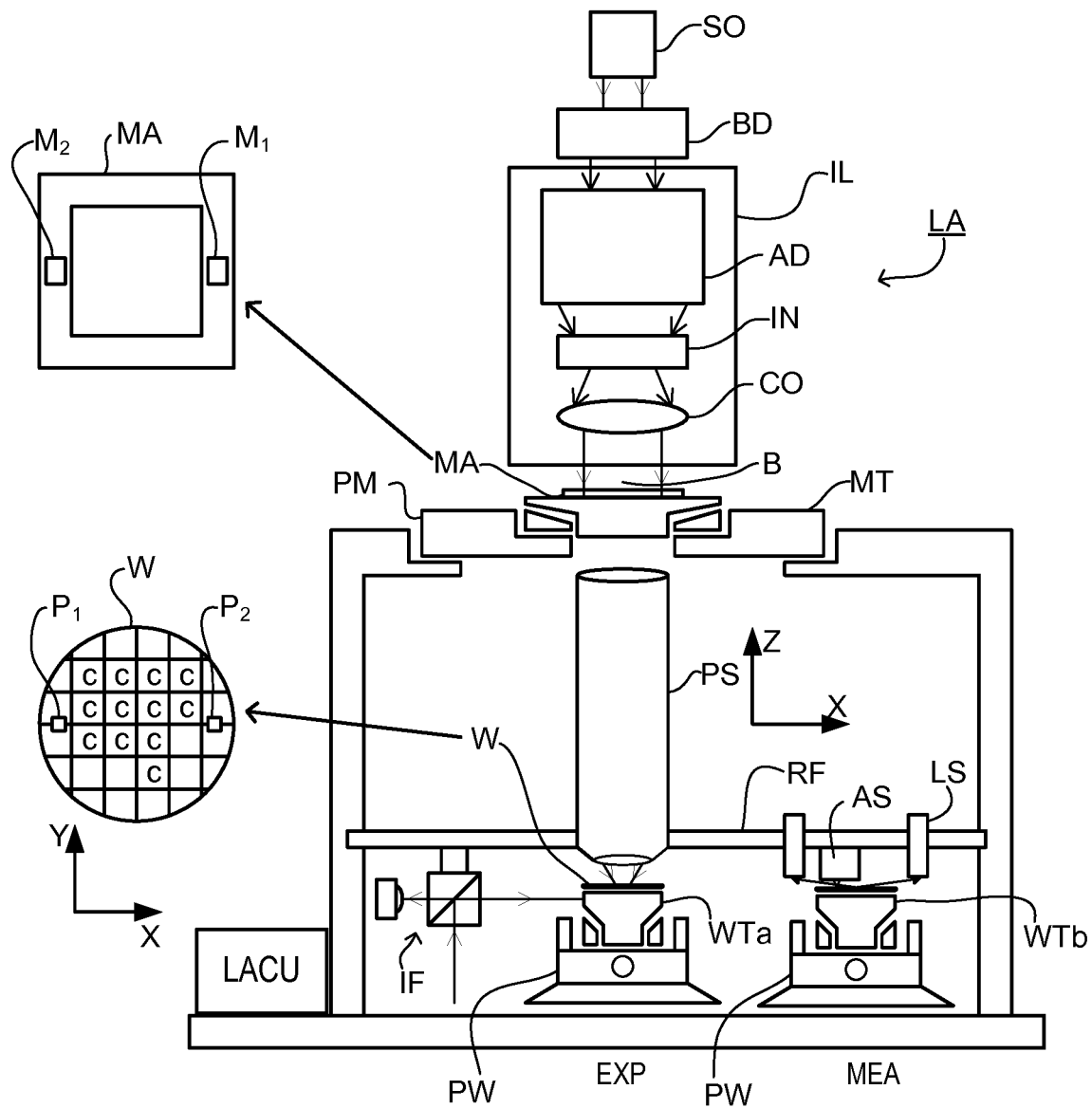
FIG. 1 depicts a lithographic apparatus configured to operate according to an embodiment of the invention.

Before describing embodiments of the invention in detail, it is instructive to present an example environment in which embodiments of the present invention may be implemented. FIG. 1 schematically depicts a lithographic apparatus LA. The apparatus comprises: an illumination system (illuminator) IL configured to condition a radiation beam B (e.g. UV radiation or EUV radiation), a reticle support (e.g. a mask table) MT constructed to support a patterning device (e.g. a mask or reticle) MA and connected to a first positioner PM configured to accurately position the patterning device in accordance with certain parameters, a substrate support (e.g. a wafer table) WTa or WTb constructed to hold a substrate (e.g. a resist coated wafer) W and connected to a second positioner PW configured to accurately position the substrate in accordance with certain parameters and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The reticle support supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The reticle support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as G-outer and G-inner, respectively) of the intensity distribution in a pupil plane of the illuminator may be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb is moved accurately, e.g. so as to position different target portions C in the path of the radiation beam B. Similarly, the first positioner PM and another position sensor (which is not explicitly depicted in FIG. 1) is used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C may be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables may be exchanged. While one substrate on one substrate table is being exposed at the exposure station EXP, another substrate is loaded onto the other substrate table at the measurement station MEA so that various preparatory steps may be carried out. The preparatory steps may include mapping the surface height of the substrate using a height sensor LS and measuring the position of alignment marks on the substrate using an alignment sensor AS. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
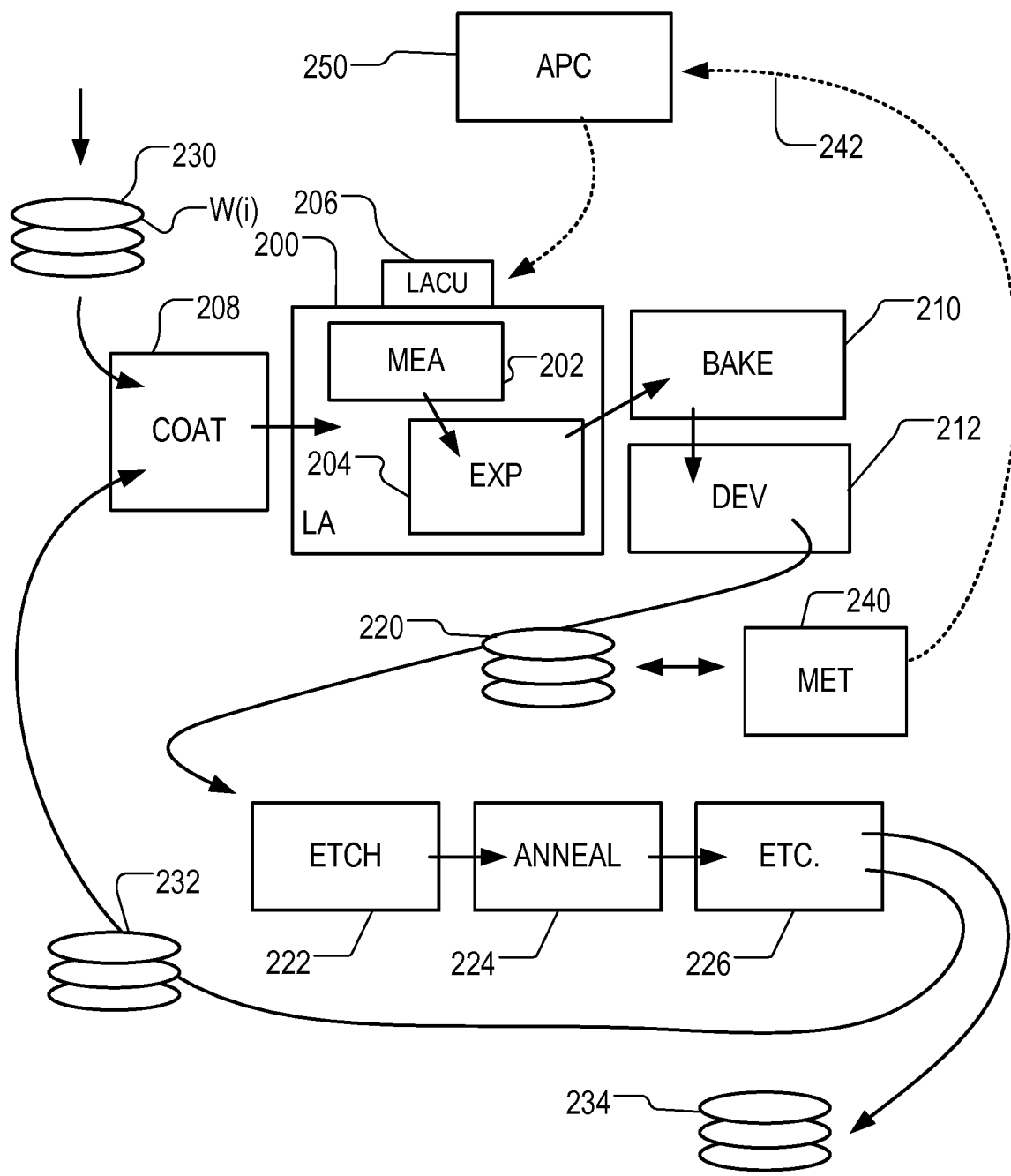
FIG. 2 shows schematically the use of the lithographic apparatus of FIG. 1 together with other apparatuses forming a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 may be used in an advanced process control (APC) system 250 to maintain accurate performance of the patterning operations in the litho cluster, by control unit LACU 206 making small adjustments over time, thereby minimizing the risk of products being made out-of-specification, and requiring re-work. Metrology apparatus 240 and/or other metrology apparatuses (not shown) may be applied to measure properties of the processed substrates 232, 234, and incoming substrates 230.

The advanced process control (APC) system 250 may for example be configured to calibrate individual lithographic apparatuses and to allow different apparatuses to be used more interchangeably. Improvements to the apparatuses' focus and overlay (layer-to-layer alignment) uniformity have recently been achieved by the implementation of a stability module, leading to an optimized process window for a given feature size and chip application, enabling the continuation the creation of smaller, more advanced chips. The stability module in one embodiment automatically resets the system to a pre-defined baseline at regular intervals, for example each day. More detail of lithography and metrology methods incorporating the stability module can be found in US2012008127A1. The known example APC system implements three main process control loops. The first loop provides the local control of the lithography apparatus using the stability module and monitor wafers. The second APC loop is for local scanner control on-product (determining focus, dose, and overlay on product wafers). The third control loop is to allow metrology integration into the second APC loop (e.g. for double patterning). All of these loops use measurements made by the inspection apparatus 240, in addition to the measurements made during the actual patterning operations. The APC system may also make use of context information describing each substrate and the processes to be applied to it.

Figure 3:
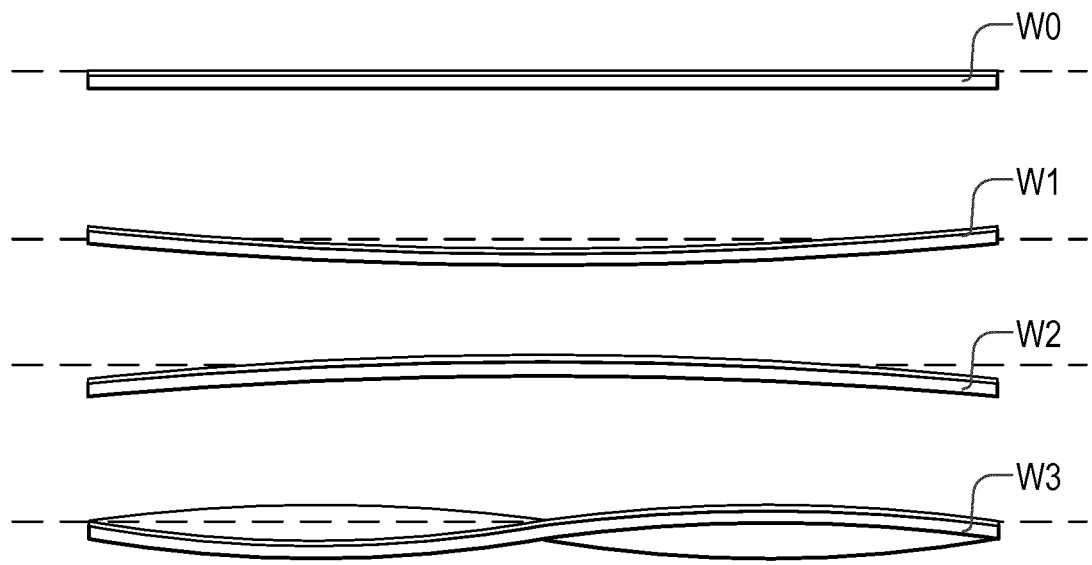
FIG. 3 illustrates an ideal flat substrate, and warped substrates having three common shapes of warp.

In FIG. 3, a substrate in the form of a semiconductor wafer W0 has a flat shape, that is to say it is unaffected by warping. Depending on the type of processing, layer materials and applied patterns, a real wafer may acquire a non-flat shape during the device manufacturing process is illustrated in FIG. 2. Referring to the shape of the wafer in its "free forced" state, when it is not subject to clamping forces, FIG. 3 also illustrates three wafers having typical warped shapes.

Wafer W1 has a "bowl" shape, meaning that its upper surface is concave. (Depending on the type of process, the upper surface and lower surface of the wafer may swap roles between operations. The "upper surface" in this context is not defined by gravity, but is the surface which does not lie against the substrate table WTa/WTb in the lithographic apparatus during a patterning or measurement operation.) Wafer W2 has a "dome" or "umbrella" shape, in which the upper surface is convex. Wafer W3 has a "saddle" shape. Each of these warped wafer shapes is symptomatic of different stresses between different layers in the substrate. It will be appreciated that shrinkage of an upper layer may lead to the bowl shape of wafer W1, expansion of an upper layer may lead to the dome shape of wafer W2. More complex stresses may lead to the saddle shape.

Figure 4:
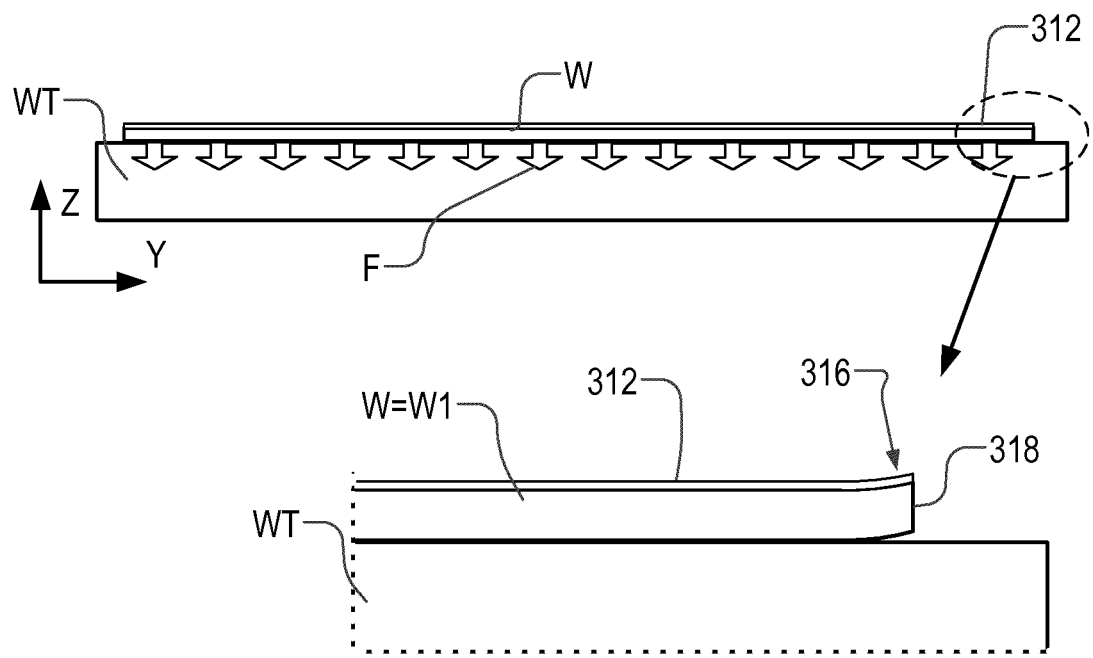
FIG. 4 illustrates a clamping action of a substrate table in the lithographic apparatus of FIG. 1, with inset detail of local unflatness in an edge region of the substrate, induced by clamping of a warped substrate having a bowl shape.

FIG. 4 illustrates a substrate W held by clamping forces F on a substrate support WT. A resist layer 312 has been coated onto the substrate, ready to receive an image carrying the pattern to be applied to the substrate by a patterning system of the lithographic apparatus LA. The clamping forces may be applied for example by suction of air through channels in the substrate table (a so-called vacuum chuck). For systems operating in a near-vacuum environment, such as an EUV lithographic apparatus, the clamping forces may be applied by electrostatic attraction. The clamping force may be varied according to a clamping recipe received from the supervisory control system SCS. In some implementations, the clamping forces different regions on the substrate table may be controlled independently. In some implementations, the timing of application of clamping forces in different regions on the substrate may be controlled, for example so that clamping forces are applied progressively outwards from a central region.

As shown in the inset detail in the lower part of FIG. 4, when a warped wafer W is held by clamping forces to the substrate table WT, the wafer becomes flat. However, imperfections in the wafer clamping may leave a residual unflatness, especially in a region 316 close to the wafer edge 318. In the illustrated example, it is assumed that wafer W has the bowl shape of wafer W1. Consequently, the residual unflatness takes the form of a slight rise in the surface of the wafer, in the edge region 316. In the case of a dome-shaped substrate W2, the residual unflatness may take the form of a dip towards the wafer edge. In the case of a saddle-shaped substrate W3, they residual unflatness may take the form of a dip around some regions of the periphery of the wafer, and a rise in other regions.

Figure 5:
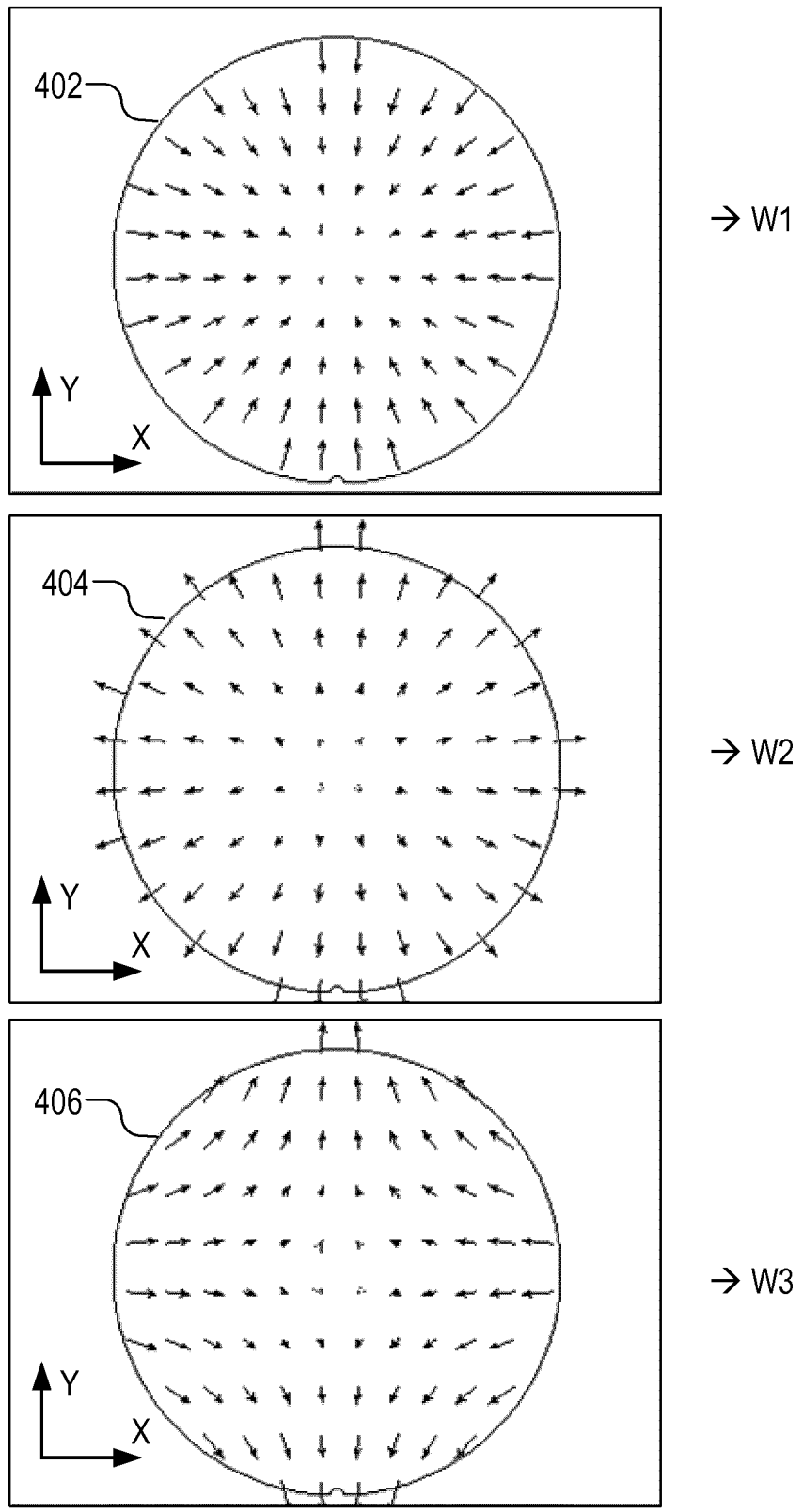
FIG. 5 illustrates three characteristics recognizable in alignment sensor data, associated with the three shapes of warp illustrated in FIG. 3.

In FIG. 5, there are three vector plots 402, 404, 406 illustrating positional deviations measured at an array of locations across three different substrates, using the alignment sensors AS of the lithographic apparatus of FIG. 1. At each location, one or more alignment marks are provided, represented schematically by the marks $P_1$ and $P_2$ in FIG. 1. This type of plot is conventionally used, and the skilled person understands that the lengths of the vectors representing positional deviations are greatly exaggerated. The deviations in practice may be on the order of a nanometer, or a few nanometers. If these positional deviations are different in the current layer from a reference layer, and if they are not corrected by suitable positioning of the applied pattern during a patterning operation, an overlay error will occur.

From these three plots, it will be seen that three very different characteristics can be recognized in the positional deviations. In plot 402, there is a uniform de-magnification effect, meaning that the measured positions of the alignment marks are shifted towards the center of the wafer, relative to the nominal positions. Conversely, in the case of plot 404, a uniform magnification effect is observed, meaning that the measured positions of the alignment marks are shifted outwards towards the edge of the wafer relative to their nominal positions. In the third plot 406, an asymmetric characteristic is observed, in which there is de-magnification in X direction, and magnification in a Y direction. It will be appreciated that this asymmetric shape could arise with any orientation relative to the X and Y axes of the lithographic apparatus and its reference frame.

Now, the wafer-scale magnification and de-magnification characteristics illustrated in FIG. 5 not generally lead to overlay errors in the applied pattern, because the alignment model on which positioning of the applied patterns is based can easily correct this distortion. However, the residual unflatness, especially in the edge regions of the substrate, may cause in-plane positional deviations that are not readily correctable by the alignment model. Reasons for this would include, for example, a lack of sufficient sampling density of alignment marks in the affected edge regions, and/or a lack of sufficient parameters in an alignment model to allow correction of highly localized deviations. Similarly, the residual unflatness may cause local focusing errors. Height map data obtained using height sensor LS may not have the spatial resolution to represent these local variations. In principle, by measuring in advance the warped shape of each wafer, a model of clamping behavior could be used to predict the residual deviations near the wafer edge. These could then be corrected, by suitable algorithm. However, although tools for measuring wafer shape are readily available, to provide and operate such tools to measure every wafer in a high-volume manufacturing facility would be very costly and may negatively impact productivity.

The inventors have recognized that, by recognizing overall characteristics in the position measurements made by the alignment sensors after the wafer has been flattened by clamping forces, the apparatus may be able to make an inference as to the shape of the warped wafer in its free forced state, without requiring any direct measurement of the wafer shape prior to clamping. Modeling the stresses in a bowl shaped wafer, as it is flattened by clamping forces, one can show that the upper layer of the substrate will be stressed in a radially inward direction, leading to the de-magnification characteristic seen in plot 402. Consequently, by recognizing the de-magnification characteristic illustrated by plot 402, the lithographic apparatus may infer without any special measurement, that the free forced shape of the wafer was a bowl shape, as in the case of wafer W1. Similarly, modeling of stresses in the clamping of warped wafers suggests that a magnification characteristic, illustrated by plot 404, is indicative of a free forced shape which is a dome shape, similar to wafer W2. Similarly, it can be shown that an asymmetric magnification effect, illustrated by plot 406, may be indicative of a saddle shape to warped wafer, similar to wafer W3.

The precise in-plane distortion characteristic imparted to the upper surface of the substrate will depend on the layer structure, materials and the patterning operations that have been applied to it, as well as the various physical and chemical treatments applied for irradiation, etching, annealing and so on. Modeling of substrate behavior under clamping forces is discussed in the paper by Brunner et al, "Characterization of wafer geometry and overlay error on silicon wafers with nonuniform stress", J. Micro/Nanolith. MEMS MOEMS 12(4), 043002 (October-December 2013) published by SPIE. Similar modeling and prediction techniques may be applied in the present apparatus. The contents of the Brunner et al paper are incorporated herein by reference. Published international patent application explains further how local height variations (unflatness) introduce in-plane positioning errors in the applied pattern, as well as the focusing errors that might be expected.

Figure 6:
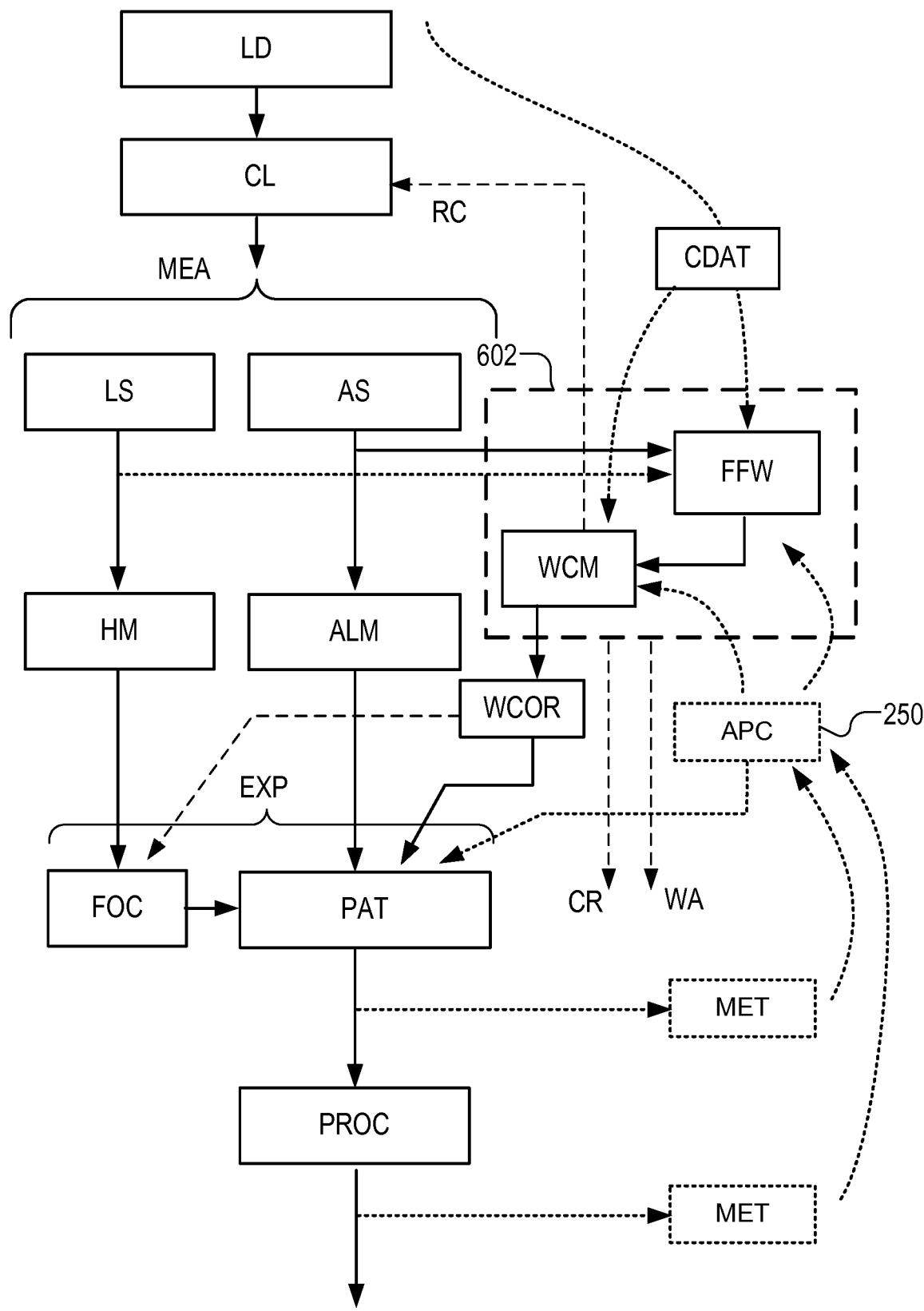
FIG. 6 is a flowchart of operation of the lithographic apparatus in the manufacture of devices, illustrating various embodiments of the present invention.

FIG. 6 is a simple flowchart summarizing the operation of the lithographic apparatus, implementing a correction in an edge region in accordance with the principles of the present disclosure. The lithographic apparatus for this purpose includes a substrate support for clamping the substrate in preparation for applying a device pattern to the substrate. In the example apparatus of FIG. 1, the substrate support for each substrate is one or other of the substrate tables WTa/WTb. The apparatus further includes an alignment sensor for measuring positions of features distributed across the clamped substrate prior to applying said pattern. The positions measured by the alignment sensor are positions in the plane of the substrate, that is to say positions or positional deviations in the X and Y directions. In the illustrated example, one or more height sensors LS are provided for measuring position and/or positional deviations of the substrate surface in the Z direction. An example of the alignment sensor AS is shown in FIG. 1 in a measurement station MEA, separated from an exposure station EXP at which a patterning operation is performed on the substrate. In other implementations, multiple alignment sensors may be provided, and/or they may be configured more closely with the patterning system.

A patterning system of the lithographic apparatus includes (in the example of FIG. 1) the projection system PS and various positioning subsystems for the patterning device MA and the substrate W. The patterning system includes the lithographic apparatus control unit LACU, which is connected and programmed to control the lithographic apparatus to apply a pattern to the clamped substrate, while positioning of the applied pattern based at least in part on the positions measured by said alignment sensor.

In operation, substrate, for example a semiconductor wafer, is loaded into the apparatus at step LD and clamped onto a substrate table at step CL. Substrates are measured using alignment sensor AS and height sensor LS. An alignment model ALM based on the alignment is used to control the positioning of an applied pattern in the patterning step PAT performed at exposure station EXP. The height map data from the height sensor is used in a focus control module FOC to control focus in the patterning step. After the pattern is applied to each target portion in patterning step PAT, the substrate is processed to create device features in accordance with the pattern, as illustrated in FIG. 2. The substrate returns for further patterning and processing steps until all product layers are complete, in the manner described above.

Using the alignment sensor measurements and the alignment model ALM, the magnification or other effects that may result from stresses in a warped wafer when clamped on the substrate table are largely corrected. However, as mentioned, the alignment model may not detect and/or may not be able to correct localized positional deviations in the edge region of the substrate, where flattening of the warped wafer is not perfectly achieved by clamping forces. In accordance with the principles of the present disclosure, the method of FIG. 6 shows how the patterning system of the lithographic apparatus of FIG. 1 is configured to apply a correction to the positioning of the applied pattern in an edge region of the substrate. This correction, which is additional to any alignment corrections and corrections that may be applied by an APC system 250. As explained above with reference to FIG. 5, this additional correction does not require a free forced wafer shape to be measured or known absolutely. Rather, it is based on recognition of a warp-induced characteristic in the positions measured across the substrate by the alignment sensor, that is to say, in the alignment data.

In the flowchart of FIG. 6, a step FFW is performed, based on the alignment data received from the alignment sensors. In principle, this alignment data is the data that would ordinarily be measured as part of the preparations for applying patterns to any substrate. No additional measurement overhead is necessary, although additional measurements may be made if desired. In step FFW, the free forced shape of the loaded and clamped substrate is estimated or inferred, based on recognition of one or other of the characteristics illustrated in FIG. 5. In practice, one or more of these characteristics is likely to be present with an amplitude that varies from wafer to wafer. The amplitude of the height variations in the free forced shape inferred in step FFW may be varied in response.

Having determined an estimate of the free forced shape of the wafer, a clamping model step WCM is performed to estimate the localized positional deviations in one or more regions of the substrate. These positional deviations are in particular those not represented in the wafer-scale characteristic itself. That is to say, having recognized that the wafer prior to clamping had a bowl shape, a dome shape or a saddle shape of a certain amplitude, the clamping model predicts that certain localized deviations in height and/or in-plane position are likely to be present. The clamping model may be defined analytically and/or by numerical simulation and/or by machine learning from previously processed substrates. A further step WCOR uses the output of the clamping model to define corrections that are used in the patterning step PAT to reduce the influence of warp-induced effects on the positioning of the applied pattern. The corrections may have a radially symmetric pattern, for example when the wafer is warped in a bowl or umbrella shape (W1 and W2 in FIG. 3) or may have a more complex pattern when the warped wafer resembles more a saddle-like shape (W3 in FIG. 3). In the latter case the correction pattern has an orientation associated with the (rotational) orientation of the saddle shape (within the plane of the substrate).

In addition to, or instead of modeling and correcting in-plane distortions caused by clamping of warped wafers, local height deviations may also be modeled and corrected, as illustrated by the dashed line leading to the focus control module FOC.

As mentioned previously, the substrate table may offer a variable clamping characteristic, and a clamping recipe may be defined for each substrate or class of substrates that is intended to provide optimum clamping of the wafer having an expected shape. In the event that an individual wafer actually has a different shape, either in the degree (amplitude) of the shape, or in the type of shape itself, it may be determined in step FFW or WCM that the clamping recipe applied to a current substrate is not the ideal one. If desired, a re-clamp command RC may be issued, causing the clamping step CL to be repeated with a new clamping characteristic, more suited to the actual shape of the current wafer. The decision whether to issue a re-clamping command may be based simply on a comparison of the observed warp-induced characteristic with the used clamping characteristic. Alternatively, the decision may be qualified by reference to the amplitude of the observed characteristic, and/or by reference to the amplitude and/or extent of local unflatness predicted by the clamping model WCM.

This re-clamping operation adds to the cycle time for processing a substrate, particularly as measurements using the alignment sensor will have to be repeated after the substrate has been re-clamped. This increase in cycle time may be minimized by performing the steps FFW and/or WCM after a coarse set of position measurements have been made using the alignment sensor. A full set of alignment measurements can be made after it has been confirmed that a suitable clamping characteristic has been applied. The increase in cycle time may also be minimized by predicting what shape and amplitude of warping may be present in each substrate. For example, in a lot of very similar substrates undergoing the same processes, it should be expected that most or all of the wafers will have similar shapes. Only in exceptional cases will the re-clamping be required. During the ongoing processing of substrates in this lot and similar lots, updated clamping recipes CR may be output, for use with future substrates based on the inferred free forced wafer shapes.

Another feature in some embodiments is the issuing of a "warp alert" flag WA (FIG. 6), if excessive warping is detected. The flag is associated with the affected substrate or substrates, in case they are so severely affected that they should omitted from further processing, or subject to further analysis. The warp alert flag WA may be generated for example when a recognized warp-induced characteristic exceeds an established alert criterion or criteria. One or more alert criteria may refer, for example, to the amplitude of the observed characteristic. Alternatively or in addition they may refer to the amplitude and/or extent of local unflatness predicted by the clamping model WCM. If desired, in an extreme case, a substrate may be flagged as "bad" and ejected automatically from the lithographic apparatus without completing the patterning operation.

Now, the skilled person will recognize that characteristics such as magnification may be found in many substrates, with causes quite unrelated to the flattening of a warped substrate. For example, heating of the substrate and/or substrate table will generally cause expansion of the material of the substrate, and consequently a magnification characteristic similar to the vector plot 404 in FIG. 5. If this symptom of heating were simply assumed to be a symptom of clamping a warped wafer, clamping model step WCM would predict local deviations in the edge region, that are not actually present. Instead of improving performance of the lithographic process by the applied corrections, performance could actually be made worse.

Accordingly, in a practical embodiment, the step FFW receives significant additional information, besides the alignment sensor position measurements. Examples of this additional information are indicated by dotted lines on the flowchart of FIG. 6. Context data CDAT relating to the substrate includes data specifying characteristics of the history of the substrate, and/or conditions present within the lithographic apparatus. One such condition is temperature. Another condition might be design details of the substrate table, and/or a wear state of the substrate table. Height data from the height sensor LS may also supplied, which may be used to support or undermine the inference of a particular warped shape. The alignment sensor AS in some embodiments may itself deliver a quality rating or reliability rating with the measurements. For example, alignment sensors using multiple wavelengths of radiation have been disclosed previously, with the idea that by comparing the signals, problems such as alignment mark deformation can be detected.

As illustrated by dotted data paths, APC system 250 uses metrology data from an inspection apparatus MET to update control of the process. Data from the APC system 250, based on metrology of many previously processed substrates may also be used to confirm or reduce the likelihood that characteristics observed in the alignment data are truly indicative of a particular warped shape. As the APC system provides its own corrections to the patterning system, it will be appreciated that the additional corrections WCOR are calculated so as not to duplicate corrections generated elsewhere. At the same time, while the APC system can measure and predict and correct deviations that affect a number of substrates of similar type and processing history, the additional corrections WCOR, being based primarily on position measurements made by the alignment sensor on the individual substrates at the time of patterning, allow for a wafer-by-wafer correction, without requiring any additional measurement overhead.

Further examples of information that may be used to refine the inference of a particular free forced shape include details of the process applied to the substrates themselves, for example the stack (deposited materials) on the front (upper) and/or back sides of the substrate, the pattern applied in previous steps. For example, a layer that has been heavily patterned and processed may expand laterally, more than the underlying substrate.

In summary, in the above example, additional corrections are calculated and applied in an edge region of the substrate in 22 or three distinct steps. By the step FFW, based at least in part on the measured positions across the substrate, one or more shape characteristics of the warped substrate are inferred. Then, in the step WCM, based at least in part on the inferred shape characteristics, a clamping model is calculated to simulate deformation of the warped substrate in response to clamping by the substrate support. Then in step WCOR, one or more corrections are calculated, based at least in part on the simulated deformation. These different steps may be implemented by respective software modules running on one or more processors within the patterning system. These processors may be part of the existing lithographic apparatus control unit, or additional processors added for the purpose. On the other hand, the functions of the steps may be combined in a single module or program, if desired, or they may be subdivided or combined in different sub-steps or sub-modules. For example, positional deviations may be calculated and then converted into corrections as a separate step, as illustrated in FIG. 6. Alternatively, corrections may be calculated directly by simulation and/or lookup, so that the steps WCM and WCOR are effectively combined into one step.

In one particular implementation in which the steps FFW and WCM are not explicitly performed as separate steps. Rather, the patterning system is configured to generate the correction by using the alignment sensor data and the other relevant information to interrogate a look-up table and retrieving data at least partly defining the additional corrections. Such a lookup table may perform the functions within the dashed box 602, for example, and/or it may include the functions of the step WCOR. The lookup table may be established by pre-programming, based on steps similar to the steps FFW and WCM. Alternatively, the lookup table may be established entirely on the basis of empirical observations of processing of a number of substrates, optionally with direct measurement of wafer shapes using wafer shape measuring tools.

Hybrid methods combining lookup tables with models may be applied. For example, a lookup table may be used to recognize the general form of a characteristic indicative of one wafer shape or other, while an amplitude value is used to set the amplitude of an applied correction.

As illustrated in FIG. 4 especially the edge region 316 of the substrate W shows a residual unflatness due to imperfections in the clamping of the substrate W towards the substrate support WT. An important cause of imperfect clamping relates to characteristics of the substrate support WT. FIG. 7 illustrates a substrate W clamped to a substrate support WT. The substrate support WT is typically provided with support structures 701 (eg pillars, burls) providing a contact surface to the substrate W. Alternatively, instead of a plurality of support structures also a single large (typically circularly shaped large burl having a size comparable to the substrate) support structure may be provided as a contact surface to the substrate. Typically the support structure or support structures do not fully extend to the edge 718 of the substrate W; the most outward support structure 702 being located at a radius Ro<radius R of the substrate W. The extension and/or coverage of the support structures across the substrate support WT is an important characteristic of the substrate support WT. The part 716 of the substrate not being supported by the support structures is typically substantially free from clamping forces, as for example vacuum suction is not provided near the edge of the substrate or vacuum suction behaves significantly different (less effective) at the edge region 716. During clamping of the substrate to the substrate support the region 710 of the substrate, being supported by the support structures 701, behaves differently from the unsupported and unclamped region 716. For example when a bowl shaped substrate (w1 in FIG. 3) is placed on the substrate support and subsequently clamped the edge region 716 of the substrate partially preserves its original (unclamped; "free forced") bowl shape while the supported region 710 becomes substantially flat.

The deviation of the wafer surface position along the normal of a reference flat plane (horizontal dotted line in FIG. 7) is denoted by w(x,y) when the substrate is in an un-clamped state and w"(x,y) in case the substrate is clamped to the substrate holder. In general w (or w") is a function of the x and y coordinate associated with a location on the substrate W. The function w(x,y) is defined as the height map of the substrate. The height map may be rotationally symmetric in which case the height map may be expressed as a function of the substrate radius: w(r)= w($\sqrt{x^2+y^2}$), the supported region 710 being described by: r= $\sqrt{x^2+y^2}$, r=<Ro and the edge region 716 by r>Ro. The height map w(x,y) is determined (eg predicted, simulated or measured) for a substrate W in a free forced state (eg no significant clamping force exerted to the substrate W). The height map w(x,y) of the substrate W is typically measured using dedicated wafer shape metrology tooling like the KLA Tencor PWG or the Ultratech Superfast system (references: i) Brunner, T. A., Zhou, Y., Wong, C. W., Morgenfeld, B., Leino, G. and Mahajan, S., "Patterned wafer geometry (PWG) metrology for improving process-induced overlay and focus problems" Proc. SPIE 9780, 97800W (2016) and ii) Anberg, D., Owen, D. M., Lee, B. H., Shetty, S. and Bouche, E., "A study of feed-forward strategies for overlay control in lithography processes using CGS technology" ASMC 2015, 395 (2015)). These tools utilize interferometric methods to derive the shape of the substrate in its free forced state.

As illustrated in FIG. 5 clamping of a non-flat substrate may lead to an in-plane distortion (commonly referred to as "IPD") of the substrate giving rise to overlay errors during subsequent patterning steps. The edge region 716 of the substrate will also demonstrate a pronounced residual unflatness w(r>Ro) or so-called out-of-plane distortion (commonly referred to as "OPD").

The IPD expresses a lateral displacement u(x,y) of a position on a substrate due to bending of the substrate and the presence of stress components. The lateral displacements u(x,y) at the wafer surface (reference: T. A. Brunner e.a., J. Micro/Nanolith. MEMS MOEMS 2014, 043002) depend on the thickness 'T' of the substrate and the local derivative of the substrate shape w(x,y) according to:

$$\vec{u}(x, y) = -\frac{T}{6} * \left[\frac{\partial w''(x, y)}{\partial x} \frac{\partial w''(x, y)}{\partial y}\right] - \frac{T}{2} * \left[\frac{\partial w''(x, y)}{\partial x} \frac{\partial w''(x, y)}{\partial y}\right]. \quad (I)$$

The first term on the right hand side of equation I is the in-plane component of thin film stress applied to the substrate, typically introduced by layers (not shown) applied to the substrate. Thin film stress may be induced, for example due to a difference between the thermal expansion coefficient of the layer and the thermal expansion coefficient of the substrate. The second term on the right hand side of formula I expresses the lateral displacement originating from stress induced by bending of the substrate.

In case of a perfectly (flat) clamped substrate W the lateral displacements due to bending of the substrate become substantially zero. Hence no bending related IPD (second term of formula I) is left across the area 710 of the substrate which is (near) optimally clamped to the substrate holder. This is different for the region 716 of the substrate which is not optimally clamped to the substrate holder. The thin film stress induced lateral displacement (first term of formula I) contributes to the IPD for both regions 710 and 716. The thin film stress induced lateral displacement is however typically registered using position measurements of alignment features applied to the substrate. Subsequent correction of the settings of the lithographic process or lithographic apparatus (eg projection lens magnification and/or substrate support positioning) based on the alignment measurements are normally implemented. Typically after correction of the lithographic apparatus (or process) no substantial IPD due to thin film stress components will remain. The only IPD term remaining is the bending related lateral displacement at the region 716 of the substrate. This term (second term formula I) is calculated according to:

$$\vec{u}(x, y) = -\frac{T}{2} * \left[\frac{\partial w''(x, y)}{\partial x} \frac{\partial w''(x, y)}{\partial y}\right] \text{ (Given: } r > Ro\text{)}. \quad (II)$$

The height map w"(x,y) is associated with the surface of the clamped substrate.

It has been found that for the unclamped region 716 the gradient of the height map w"(x,y) of the clamped substrate may be derived from the gradient of the height map w(x,y) of the un-clamped substrate and a correction term. The correction term basically models the effect of clamping the region 710 of the substrate to the gradient of the height map of the un-clamped region 716. The correction term is derived from the principle of continuity of the height map gradient across the substrate. It is then derived that the correction term equals the height map gradient of the un-clamped substrate at the boundary r=Ro between the clamped and the un-clamped regions of the substrate. The correction term 'Coe' is then:

$$Cor = -\frac{T}{2} * \left[ \frac{\partial w_{R=Ro}(x, y)}{\partial x} \quad \frac{\partial w_{R=Ro}(x, y)}{\partial y} \right]$$

and hence the IPD may be expressed as a function of the un-clamped height map $$w(x, y): \vec{u}(x, y) = -\frac{T}{2} * \left[ \frac{\partial w(x, y)}{\partial x} \quad \frac{\partial w(x, y)}{\partial y} \right] + \frac{T}{2} * \left[ \frac{\partial w_{R=Ro}(x, y)}{\partial x} \quad \frac{\partial w_{R=Ro}(x, y)}{\partial y} \right] r > Ro \quad \text{(III)}$$

Based on the characteristics of the substrate support the radius Ro may be determined and subsequently the gradient of the height map w(x,y) may be determined for the substrate at the region R=Ro. Formula III allows accurate prediction of the IPD caused by the residual unflatness (eg residual bending) of the region 716 of the substrate W.

The support structures 701 are arranged according to a particular configuration of the substrate support WT, determining the extension of the regions 710 and 716 and hence the area on the substrate where formula III is applicable to predict the IPD. In general the IPD is closely related to the overlay error of the lithographic process and hence it is important to correct the IPD, or at least mitigate the effects of the IPD on the overlay performance of the lithographic process. The predicted IPD may then subsequently be used to determine a correction to the lithographic apparatus or lithographic process mitigating the (overlay) effects of said IPD. This may for example be a correction specifically targeted at the (edge) region 716 of the substrate (eg correction not applied in the (central) region 710 of the substrate).

The correction may be associated with a projection lens adjustment or an adjustment of the substrate support position applied during the lithographic process.

In an embodiment a height map of a region of the substrate is determined, wherein the region is determined based on a characteristic of a substrate support and a correction is determined based on the height map and the characteristic of the substrate support;

In an embodiment the correction is based on calculation of an in-plane-distortion of the region of the substrate.

In an embodiment the correction is based on mitigation of the effect of the in-plane-distortion of the region of the substrate to the overlay of a lithographic process.

In an embodiment the correction is associated with a projection lens adjustment of the lithographic apparatus.

In an embodiment the correction is associated with an adjustment of the position of the substrate support during the lithographic process.

In an embodiment the height map of the substrate is determined from an interferometric measurement of a free forced shape of the substrate.

In an embodiment the characteristic of the substrate support is a distribution of substrate support structures.

In an embodiment the region 716 of the substrate is not supported by support structures 701 provided on the substrate support WT.

In an embodiment the region 716 is an edge region of the substrate.

As described the IPD remaining at the unclamped region of the substrate may be corrected by the lithographic apparatus. For the region 716 also the OPD may be significant and hence a so-called focus correction (either implemented by a change in focal position of the projection lens or a shift of the substrate support along the optical axis) may be advantageous for the performance of the lithographic process.

In analogy to using the measured height map w(x,y) for predicting lateral displacements of features applied to the substrate also out-of-plane displacements (focus errors) occurring at the unclamped region of the substrate may be predicted. These out-of-plane displacements may be derived directly from the height map w"(x,y); OPD(r>Ro)=w" (r>Ro). The clamped height map w"(x,y) may be derived from the un-clamped height map w(x,y) using the fact that the value of w(r) is substantially zero for r=Ro (continuity of w"(r)) and its derivative $$\frac{\partial w_{R=Ro}(r)}{\partial r}$$

is continuous across the substrate. The following equation expresses the out-of-plane displacement OPD as a function of the radius r outside the clamped area:

$$OPD(r) \equiv w''(r) = w(r) + \frac{\partial w_{R=Ro}(r)}{\partial r} * (Ro - r) - w(Ro) \quad \text{(IV)}$$

Formula IV may be used to predict the OPD as a function of radius r given r>Ro.

In an embodiment a correction to a lithographic apparatus is based on calculation of an out-of-plane-distortion of a region of the substrate which is clamped sub-optimally to a substrate support. The correction is calculated using height map data and knowledge of a characteristic of the substrate support.

In an embodiment the correction is an adjustment of a projection lens and/or positioning of the substrate, wherein the correction is based on mitigation of an out-of-plane-distortion of the sub-optimally clamped region 716 of the substrate.

The height map w(x,y) may also be determined from height measurements within the patterning tool (lithographic apparatus). As illustrated in FIG. 1 a sensor LS (commonly referred to as "Level Sensor" or "Height Sensor") provides measurement of a height map of the substrate W prior to exposure of the substrate W. More information on the level sensor system can be found in U.S. Patent Application Publication No. US20070085991, which is incorporated herein by reference. During the height measurement the substrate is clamped to a substrate suppport WTb which is also used during a subsequent patterning step. FIG. 8a discloses a result of a height map measurement of a substrate; the level of gray indicates the height value at a certain location on the substrate. The region 810 of the substrate is optimally supported by the support structures 701 and the region 820 of the substrate is not supported or sub-optimally supported by the support structures during the height measurement. In practice the region 810 does not always extend to the most outwardly placed support structure 702 as the residual unflatness may influence the substrate height map down to a radius smaller than Ro. The region 820 of the substrate may then not fully coincide with the region 716 as depicted in FIG. 7, but extend radially more inwards. The circular dotted line in FIG. 8a is hence typically not positioned at r=Ro, but at r=R1<Ro.

The substrate region 820 is substantially shaped according to a) the substrate in its free forced state and b) the effect of clamping. Height measurements associated with the region 820 are representative of the height map w"(x,y). The lateral displacement may be determined using formula II applied to the measured height map w"(x,y), while out-of-plane displacements may be determined directly from the height map w"(x,y).

According to an embodiment the height map w"(x,y) obtained from the level sensor measurement may be translated to a radial height map 830 as depicted in FIG. 8b. The method to translate the two dimensional height map w"(x,y) to a one-dimensional radial height map w"(r) may be based on segmentation of the substrate into triangularly shaped regions (segments) 840 (area between the two radially oriented dotted lines and the outer edge of the substrate, as illustrated in FIG. 8a). The function w"(r) may be determined per segment. This determination may involve fitting a fourth order radial polynomial $w"(r)=a*r^4+b*r^3+c*r^2+d*r+e$ per segment to the height map w"(x,y). It is however also possible to utilize other polynomials of at least second order. Fitting the radial profile to a polynomial function allows the use of analytical determination of the IPD per segment according to formula II. The OPD may be obtained directly from the radial fit of the height profile: OPD=w"(r).

In addition to determination of the IPD and OPD the determined radial function w"(r) may be used to derive the extension of the optimally clamped region 810 of the substrate and the sub-optimally clamped region 820 of the substrate. As shown in FIG. 8b (vertical dotted line) there exists a maximal radial position on the substrate where the substrate is still substantially flat. This position may be determined for each azimuthal segment of the substrate to derive a general map of (x,y) positions associated with the maximum radial extension of the region 810 (or alternatively the minimum radial position of the region 820).

The OPD is representative of a focus offset of a substrate at a certain position (x,y) and may be used by a focus controller of a lithographic apparatus to optimize the position of the substrate relative to a focal plane of the projection optics of the lithographic apparatus.

In an embodiment the height map of the substrate is determined from a height sensor measurement performed on the substrate.

In an embodiment the height map is converted to a radial profile.

In an embodiment the radial profile is determined for a plurality of azimuthal segments distributed across the substrate.

In an embodiment the radial profile is fitted to a polynomial function.

In an embodiment the polynomial function is a fourth order polynomial.

In an embodiment the IPD is derived from the radial profile or the polynomial function.

In an embodiment the OPD is derived from the radial profile or the polynomial function.

In an embodiment the radial function is used to determine the extension of an optimally clamped region 810 of the substrate.

In an embodiment the radial function is used to determine the extension of a sub-optimally clamped region 820 of the substrate.

Figure 9:
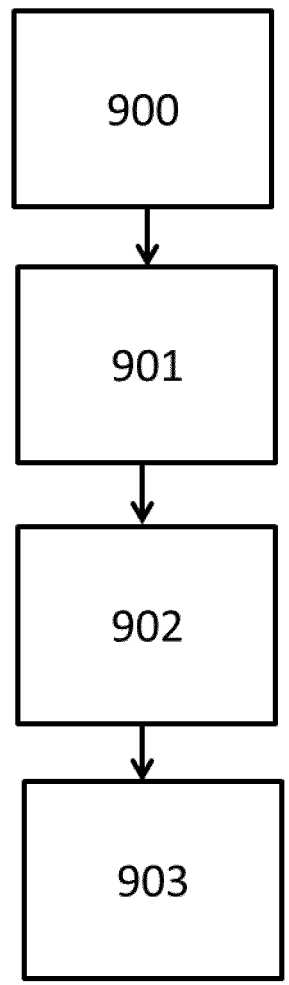
FIG. 9 depicts a flow of operation of a device manufacturing process according to an embodiment of the invention.

FIG. 9 illustrates a generally applicable flow of controlling the lithographic apparatus or device manufacturing process using the measured height map (either using the level sensor LS, offline measurement of the substrate geometry or by reconstruction based on alignment data). In step 900 the height map data is generated. Subsequently in a step 901 the height map data associated with a sub-optimally clamped region of the substrate is determined. In step 902 the height map data obtained in step 901 is combined with knowledge of the substrate support to derive in-plane distortion (IPD) and/or out-of-plane distortion (OPD) data associated with the sub-optimally clamped substrate. In step 903 the controllers of the lithographic apparatus use the derived IPD and/or OPD data to position the substrate and/or adjust the projection lens during patterning of the substrate.

Further embodiments according to the invention are provided in below numbered clauses:

1. A lithographic apparatus for applying a pattern onto a substrate, the apparatus including: a substrate support for clamping the substrate; an alignment sensor for measuring positions of features distributed across the clamped substrate; and a patterning system configured to apply said pattern to the clamped substrate while positioning the applied pattern based at least in part on positions measured by said alignment sensor, wherein said patterning system is configured to apply a correction to the positioning of the applied pattern in one or more regions of the substrate, based on recognition of a warp-induced characteristic in positions measured across the substrate by the alignment sensor.
2. An apparatus according to clause 1, wherein said warp-induced characteristic is one which indicates deformation of a warped substrate by said clamping.
3. An apparatus according to clause 2, wherein said patterning system is configured to recognize a warp-induced characteristic which indicates flattening of a warped substrate having at least one of a bowl-shape, a dome-shape and a saddle-shape.
4. An apparatus according to clause 3, wherein said patterning system is configured to distinguish between warp-induced characteristics that indicate flattening of differently-shaped warped substrates, and to apply different corrections according to the shape of warped substrate indicated by the recognized characteristic.
5. An apparatus according to any of clauses 1 to 4, wherein said patterning system is configured to apply said correction with an amplitude based on an observed amplitude of the warp-induced characteristic.
6. An apparatus according to any of clauses 1 to 5, wherein said patterning system is configured to adjust an orientation of said correction in a case where the recognized characteristic indicates flattening of a saddle-shaped substrate.
7. An apparatus as claimed in any preceding clause, wherein said patterning system is configured to generate said correction by (i) based at least in part on the measured positions across the substrate, inferring one or more shape characteristics of the warped substrate, (ii) based at least in part on the inferred shape characteristics, applying a clamping model to simulate deformation of the warped substrate in response to said clamping, and (iii) calculating said correction based at least in part on the simulated deformation.
8. An apparatus according to any of clauses 1 to 7, wherein said patterning system is configured to generate said correction by, based at least in part on the measured positions across the substrate, interrogating a look-up table and retrieving data at least partly defining said correction.
9. An apparatus according to any preceding clause, wherein said patterning system is configured to take additional information into account to reduce the influence of factors other than flattening of a warped substrate, prior to generating said correction.
10. An apparatus according to clause 9, wherein the apparatus further includes a height sensor for measuring topographical variations over the clamped substrate, and wherein said additional information includes data representing said topographical variations.
11. An apparatus according to any of clauses 9 to 10, wherein said additional information represents one or more of: position measurements made on a previous layer on the same substrate; a processing history of the substrate; a wear state of said substrate support; a temperature of the substrate and/or substrate support; reliability of the measurements made by the alignment sensor; an applied clamping action; process corrections.
12. An apparatus according to any preceding clause, wherein the applied correction affects positioning of the pattern primarily in an edge region of the substrate.
13. An apparatus according to any preceding clause, wherein the applied correction affects positioning of the pattern in one or more directions parallel to a plane of the substrate.
14. An apparatus according to any preceding clause, wherein said correction affects positioning of the pattern in a direction perpendicular to a plane of the substrate.
15. An apparatus according to any preceding clause, wherein said patterning system is further configured to vary a clamping characteristic of said substrate table in response to the recognized characteristic, prior to applying the pattern.
16. An apparatus according to clause 15, wherein said patterning system is configured to determine whether to vary the clamping characteristic by comparing a used clamping characteristic with a clamping characteristic associated with the recognized characteristic.
17. An apparatus according to clause 15 or 16, wherein the clamping characteristic is variable in terms of relative strengths of clamping forces applied at different regions of the substrate and/or relative timing of applying clamping force at different regions of the substrate.
18. An apparatus according to any preceding clause, further comprising an alert generator for alerting an operator when a recognized warp-induced characteristic meets one or more alert criteria.
19. A device manufacturing method comprising applying patterns in one or more layers on a substrate and processing the substrate to produce functional device features, wherein the step of applying a pattern in at least one of said layers comprises: (a) clamping the substrate onto a substrate support; (b) measuring positions of features distributed across the clamped substrate; and (c) applying said pattern to the clamped substrate while positioning the applied pattern based at least in part on some or all of positions measured in step (b), wherein said patterning step (c) includes applying a correction to the positioning of the applied pattern in one or more regions of the substrate, based on recognition of a warp-induced characteristic in some or all of the positions measured across the substrate in step (b).
20. A method according to clause 19, wherein said warp-induced characteristic is one which indicates deformation of a warped substrate by said clamping.
21. A method according to clause 20, wherein step (c) includes recognizing a warp-induced characteristic which indicates flattening of a warped substrate having at least one of a bowl-shape, a dome-shape and a saddle-shape.
22. A method according to clause 21, wherein step (c) includes distinguishing between warp-induced characteristics that indicate flattening of differently-shaped warped substrates, and to apply different corrections according to the shape of warped substrate indicated by the recognized characteristic.
23. A method according to any of clauses 19 to 22, wherein step (c) includes applying said correction with an amplitude based on an observed amplitude of the warp-induced characteristic.
24. A method according to any of clauses 19 to 23, wherein step (c) includes adjusting an orientation of said correction in a case where the recognized characteristic indicates flattening of a saddle-shaped substrate.
25. A method according to any of clauses 19 to 24, wherein step (c) includes generating said correction by (i) based at least in part on the measured positions across the substrate, inferring one or more shape characteristics of the warped substrate, (ii) based at least in part on the inferred shape characteristics, applying a clamping model to simulate deformation of the warped substrate in response to said clamping, and (iii) calculating said correction based at least in part on the simulated deformation.
26. A method according to any of clauses 19 to 25, wherein step (c) includes generating said correction by, based at least in part on the measured positions across the substrate, interrogating a look-up table and retrieving data at least partly defining said correction.
27. A method according to any of clauses 19 to 26, wherein in step (c) additional information is taken into account to reduce the influence of factors other than flattening of a warped substrate, prior to generating said correction.
28. A method according to clause 27, wherein the step (b) further includes measuring topographical variations over the clamped substrate, and wherein said additional information includes data representing said topographical variations.
29. A method according to any of clauses 27 to 28, wherein said additional information represents one or more of: position measurements made on a previous layer on the same substrate; a processing history of the substrate; a wear state of said substrate support; a temperature of the substrate and/or substrate support; reliability of the measurements made by the alignment sensor; an applied clamping action; process corrections.
30. A method according to any of clauses 19 to 29, wherein the applied correction affects positioning of the pattern primarily in an edge region of the substrate.
31. A method according to any of clauses 19 to 30, wherein the applied correction affects positioning of the pattern in one or more directions parallel to a plane of the substrate.
32. A method according to any of clauses 19 to 31, wherein said correction affects positioning of the pattern in a direction perpendicular to a plane of the substrate.
33. A method according to any of clauses 19 to 32, wherein step (c) further includes varying a clamping characteristic of said substrate table in response to the recognized characteristic, prior to applying the pattern.

34. A method according to clause 33, wherein step (c) includes determining whether to vary the clamping characteristic by comparing a used clamping characteristic with a clamping characteristic associated with the recognized characteristic.

35. A method according to any of clauses 33 to 34, wherein the clamping characteristic is variable in terms of relative strengths of clamping forces applied at different regions of the substrate and/or relative timing of applying clamping force at different regions of the substrate.

36. A method according to any preceding clause, further comprising an alert generator for alerting an operator when a recognized warp-induced characteristic meets one or more alert criteria.

37. A computer program product comprising machine-readable instructions for causing one or more processors to control the patterning system of a lithographic apparatus to recognize a characteristic and apply a correction according to any of clauses 1 to 18.

38. A data processing system comprising one or more processors programmed to control the patterning system of a lithographic apparatus by recognizing a warp-induced characteristic and applying a correction according to any of clauses 1 to 18.

39. A computer program product comprising machine-readable instructions for causing one or more processors to perform the step (c) of a method according to any of clauses 19 to 36.

40. A data processing system comprising one or more processors programmed to perform the step (c) of a method according to any of clauses 19 to 36.

41. A device manufacturing method for applying patterns in one or more layers on a substrate clamped to a substrate support, the device manufacturing method comprising: determining a height map of a region of the substrate, wherein the region is determined based on a characteristic of the substrate support; and determining a correction to the device manufacturing method based on the height map and the characteristic of the substrate support.

42. A method according to clause 41, wherein the height map is determined from an interferometric measurement of a free forced shape of the substrate.

43. A method according to clause 42, wherein the height map is determined from measurements of a height sensor on the substrate.

44. A method according to clause 43, wherein the substrate is clamped to the substrate support during the measurements.

45. A method according to any of clauses 41 to 44, wherein the correction is based on calculation of an in-plane-distortion of the region of the substrate.

46. A method according to any of clauses 41 to 45, wherein the correction is based on calculation of an out-of-plane-distortion of the region of the substrate.

47. A method according to clause 45, wherein the correction is based on mitigation of an in-plane-distortion of the region of the substrate.

48. A method according to clause 46, wherein the correction is based on mitigation of an out-of-plane-distortion of the region of the substrate.

49. A method according to any of clauses 41 to 48, further comprising a step of applying patterns to the substrate while using the correction for positioning of the substrate.

50. A method according to any of clauses 41 to 49, further comprising a step of applying patterns to the substrate while using the correction to adjust a projection lens setting.

51. A method according to any of clauses 41 to 50, wherein the characteristic is associated with an extension of a support structure provided to the substrate support.

52. A method according to any of clauses 41 to 51, wherein the characteristic is associated with a distribution of support structures provided to the substrate support.

53. A method according to any of clauses 41 to 52, wherein the region of the substrate is associated with sub-optimal clamping of the substrate to the substrate support.

54. A method according to any of clauses 41 to 53, wherein the region of the substrate is associated with sub-optimal support of the substrate by the support structures provided to the substrate support.

55. A method according to any of clauses 41 to 54, wherein the region of the substrate comprises an edge region of the substrate.

56. A method according to clause 44, further comprising a step of determining a radial profile associated with the height map.

57. A method according to clause 44 or 56, further comprising a step of partitioning the height map into segments and determining for each segment a corresponding radial profile.

58. A method according to clause 56 or 57, further comprising a step of fitting the radial profile to a polynomial function, preferably of fourth order.

59. A method according to any of clauses 56 to 58, wherein the in-plane-distortion of the region of the substrate is calculated from the radial profile or the polynomial function.

60. A method according to any of clauses 56 to 58, wherein the out-of-plane-distortion of the region of the substrate is calculated from the radial profile or the polynomial function.

61. A method according to any of clauses 56 to 60, wherein the characteristic of the substrate support is determined from the radial profile or the polynomial function fitted to the radial profile.

62. A lithographic apparatus for applying a pattern onto a substrate, the apparatus including: a substrate support for clamping the substrate, a height sensor for measuring a height map of the clamped substrate, and a patterning system configured to apply the pattern to the clamped substrate while positioning the applied pattern, wherein the patterning system is configured to apply a correction to the positioning of the applied pattern based on the height map and a characteristic of the substrate support.

63. A lithographic apparatus according to clause 62, wherein the correction is determined using a method according to any of clauses 41 to 61.

64. A computer program product comprising machine-readable instructions for causing one or more processors to determine the correction using a method according to any of clauses 41 to 61.

65. A data processing system comprising one or more processors programmed to control the patterning system of a lithographic apparatus by determining the correction using a method according to any of clauses 41 to 61.

Conclusion

In conclusion, the present disclosure provides a lithographic apparatus and methods of operating a lithographic apparatus in which localized in-plane distortions and/or height variations caused by clamping warped wafers may be corrected using height map or alignment measurements, the height map measurements may be performed either within the lithographic apparatus or outside the lithographic apparatus.

An embodiment of the invention may be implemented using a computer program containing one or more sequences of machine-readable instructions describing methods of recognizing characteristics in position data obtained by alignment sensors, and applying corrections as described above. This computer program may be executed for example within the control unit LACU of FIG. 1, or some other controller. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A device manufacturing method for applying patterns in one or more layers on a substrate clamped to a substrate support, the device manufacturing method comprising:
   determining a height map of a region of the substrate, wherein the region is determined based on a characteristic of the substrate support; and
   determining a correction to the device manufacturing method based on the height map and the characteristic of the substrate support.

2. The method as claimed in claim 1, wherein the height map is determined from an interferometric measurement of a free forced shape of the substrate.

3. The method as claimed in claim 1, wherein the height map is determined from measurements by a height sensor on the substrate when the substrate is clamped on the substrate support.

4. The method as claimed in claim 1, wherein the correction is based on calculation of an in-plane-distortion of the region of the substrate.

5. The method as claimed in claim 1, wherein the correction is based on calculation of an out-of-plane-distortion of the region of the substrate.

6. The method as claimed in claim 1, further comprising applying patterns to the substrate while using the correction for positioning of the substrate and/or adjusting a projection system setting.

7. The method as claimed in claim 1, wherein the characteristic is associated with an extension of one or more support structures provided to the substrate support.

8. The method as claimed in claim 1, wherein the characteristic is associated with a distribution of support structures provided to the substrate support.

9. The method as claimed in claim 1, wherein the region of the substrate is associated with sub-optimal clamping or sub-optimal support provided by the substrate support to the substrate.

10. The method as claimed in claim 1, wherein the region of the substrate comprises an edge region of the substrate.

11. The method as claimed in claim 1, further comprising determining a radial profile associated with the height map.

12. The method as claimed in claim 11, wherein an in-plane-distortion of the region of the substrate is calculated from the radial profile.

13. The method as claimed in claim 11, wherein an out-of-plane-distortion of the region of the substrate is calculated from the radial profile.

14. The method as claimed in claim 11, wherein the characteristic of the substrate support is determined from the radial profile.

15. A lithographic apparatus for applying a pattern onto a substrate, the apparatus including:
   a substrate support configured to clamp the substrate;
   a height sensor configured to measure a height map of the clamped substrate; and
   a patterning system configured to apply the pattern to the clamped substrate while or after positioning the applied pattern, wherein the patterning system is configured to apply a correction to the positioning of the applied pattern based on the height map and a characteristic of the substrate support.

16. The lithographic apparatus of claim 15, wherein the height map is determined from an interferometric measurement of a free forced shape of the substrate.

17. A non-transitory computer program product comprising machine-readable instructions, when executed, configured to cause one or more processors to at least:
   determine a height map of a region of a substrate, wherein the region is determined based on a characteristic of a substrate support of the substrate; and
   determine a correction to a device manufacturing method for applying patterns in one or more layers on the substrate when clamped on the substrate support, based on the height map and the characteristic of the substrate support.

18. The computer program product of claim 17, wherein the machine-readable instructions are further configured to cause the one or more processors to control a patterning system of a lithographic apparatus to recognize the characteristic and apply the correction.

19. The computer program product of claim 17, wherein the height map is determined from an interferometric measurement of a free forced shape of the substrate.

20. The computer program product of claim 17, wherein the correction is based on calculation of an in-plane-distortion of the region of the substrate.

* * * * *

UNITED STATES PATENT AND TRADEMARK OFFICE
CERTIFICATE OF CORRECTION

PATENT NO.         : 10,545,410 B2
APPLICATION NO.    : 16/076743
DATED              : January 28, 2020
INVENTOR(S)        : Hakki Ergun Cekli et al.

It is certified that error appears in the above-identified patent and that said Letters Patent is hereby corrected as shown below:

On the Title Page

On page 2, item (56) References Cited Line 11 Should read:
-- "TURNER, Kevin T., et al: 'Relationship between localized wafer shape changes induced by residual stress and overlay errors". JOURNAL OF MICRO/NANOLITHOGRAPHY, MEMS, AND MOEMS, vol. 11, no. 1, 21 March 2012, pp. 013001-013001-8" --

Signed and Sealed this
Seventh Day of April, 2020

Andrei Iancu
*Director of the United States Patent and Trademark Office*